(12) United States Patent
Tai et al.

(10) Patent No.: US 11,107,774 B2
(45) Date of Patent: Aug. 31, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Li-Hua Tai, Kaohsiung (TW); Pai-Chou Liu, Kaohsiung (TW); Yun-Chih Fei, Kaohsiung (TW); Wen-Pin Huang, Kaohsiung (TW); Sheng-Hong Zheng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/388,834

(22) Filed: Apr. 18, 2019

(65) Prior Publication Data

US 2020/0335452 A1 Oct. 22, 2020

(51) Int. Cl.

| H01L 23/552 | (2006.01) |
|---|---|
| H01L 23/13 | (2006.01) |
| H01L 23/367 | (2006.01) |
| H01L 23/498 | (2006.01) |
| H01L 21/48 | (2006.01) |
| H01L 23/00 | (2006.01) |

(52) U.S. Cl.
CPC ........ *H01L 23/552* (2013.01); *H01L 21/486* (2013.01); *H01L 21/4853* (2013.01); *H01L 21/4871* (2013.01); *H01L 23/13* (2013.01); *H01L 23/367* (2013.01); *H01L 23/49816* (2013.01); *H01L 23/49827* (2013.01); *H01L 23/49833* (2013.01); *H01L 24/16* (2013.01); *H01L 2224/16225* (2013.01); *H01L 2924/19105* (2013.01); *H01L 2924/3025* (2013.01)

(58) Field of Classification Search
CPC . H01L 23/552; H01L 21/4871; H01L 23/367; H01L 23/49827; H01L 23/49816; H01L 21/486; H01L 24/16; H01L 23/13; H01L 23/49833; H01L 21/4853; H01L 2924/3025; H01L 2224/16225; H01L 2924/19105; H01L 23/373; H01L 23/4981; H01L 23/5385
See application file for complete search history.

(56) References Cited

U.S. PATENT DOCUMENTS

| 2005/0168961 | A1* | 8/2005 | Ono ....................... H05K 1/144 361/784 |
|---|---|---|---|
| 2013/0063913 | A1* | 3/2013 | Yoshida .................... G06F 1/26 361/760 |
| 2018/0068983 | A1* | 3/2018 | Chang ................. H01L 21/6835 |

(Continued)

*Primary Examiner* — Yasser A Abdelaziez
(74) *Attorney, Agent, or Firm* — Foley & Lardner LLP

(57) ABSTRACT

A semiconductor device package includes a substrate, a first electronic component, a second electronic component, a package body and a shield. The substrate has a first surface and a second surface opposite to the first surface. The substrate defines a cavity from the second surface extending into the substrate. The first electronic component is disposed on the first surface of the substrate. The second electronic component is disposed within the cavity of the substrate. The package body is disposed on a portion of the first surface of the substrate and covers the first electronic component. The shield is disposed on external surfaces of the package body.

24 Claims, 24 Drawing Sheets

(56) References Cited

U.S. PATENT DOCUMENTS

| | | | |
|---|---|---|---|
| 2018/0240757 A1* | 8/2018 | Wong | H01L 23/552 |
| 2018/0323170 A1* | 11/2018 | Kim | H01L 21/56 |
| 2019/0067207 A1* | 2/2019 | Hu | H01L 23/49866 |
| 2019/0189599 A1* | 6/2019 | Baloglu | H01L 23/3675 |

* cited by examiner

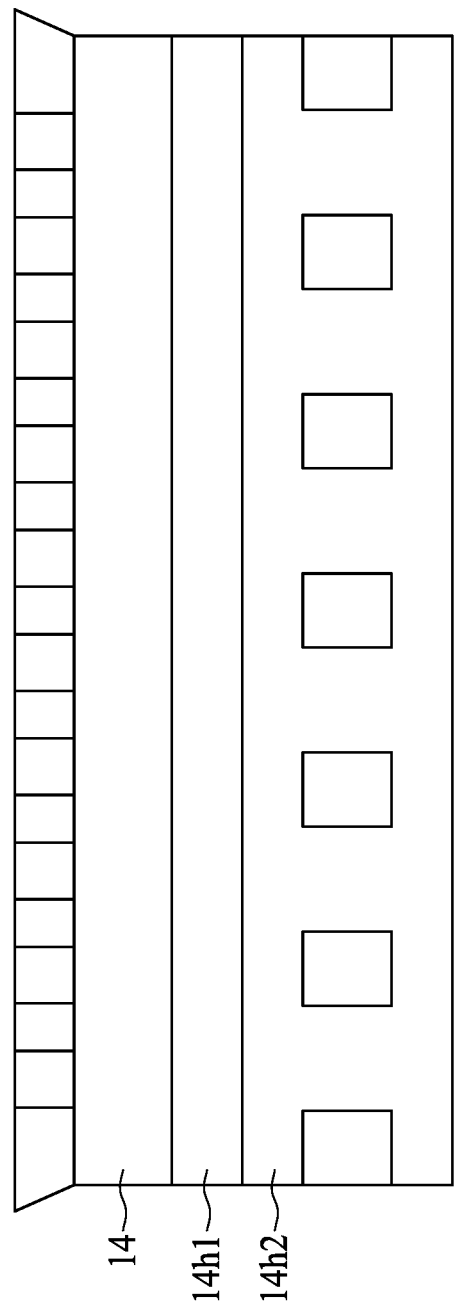

SEMICONDUCTOR DEVICE PACKAGE AND METHOD OF MANUFACTURING THE SAME

BACKGROUND

1. Technical Field

The present disclosure relates to a semiconductor device package and a method of manufacturing the same.

2. Description of the Related Art

A semiconductor package device may include multiple electronic components to increase its performance and functionality. To reduce the area or footprint of a semiconductor package device, electronic components may be mounted to both a top surface and a bottom surface of a substrate. The electronic components can be arranged side-by-side on the top surface or the bottom surface of the substrate. However, this will increase the area of semiconductor device package. The electronic components may be arranged in a stacking arrangement. However, this will increase the thickness of the semiconductor device package, which will in turn hinder the semiconductor device package from being connected to another circuit board.

SUMMARY

In accordance with some embodiments of the present disclosure, a semiconductor device package includes a substrate, a first electronic component, a second electronic component, a package body and a shield. The substrate has a first surface and a second surface opposite to the first surface. The substrate defines a cavity from the second surface extending into the substrate. The first electronic component is disposed on the first surface of the substrate. The second electronic component is disposed within the cavity of the substrate. The package body is disposed on a portion of the first surface of the substrate and covers the first electronic component. The shield is disposed on external surfaces of the package body.

In accordance with some embodiments of the present disclosure, a semiconductor device package includes a first substrate, a first electronic component, a second electronic component, a frame board, a package body and a shield. The first substrate has a first surface and a second surface opposite to the first surface. The first electronic component is disposed on the first surface of the first substrate. The second electronic component is disposed on the second surface of the first substrate. The frame board is disposed on the second surface of the first substrate and surrounds the second electronic component. The package body is disposed on a portion of the first surface of the first substrate and covers the first electronic component. The shield is disposed on external surfaces of the package body.

In accordance with some embodiments of the present disclosure, a method of manufacturing an optical module includes (a) providing a first substrate having a first surface and a second surface opposite to the first surface; (b) disposing a first electronic component on the first surface of the first substrate; (c) disposing a frame board on the first surface of the first substrate to surround the first electronic component, the frame board having conductive vias penetrating the frame board and electrically connected to the first substrate; and (d) connecting a second electronic component on the second surface of the first substrate.

BRIEF DESCRIPTION OF THE DRAWINGS

FIG. 1B illustrates an enlarged view of a heat dissipation element in accordance with some embodiments of the present disclosure.

Figure 1A:
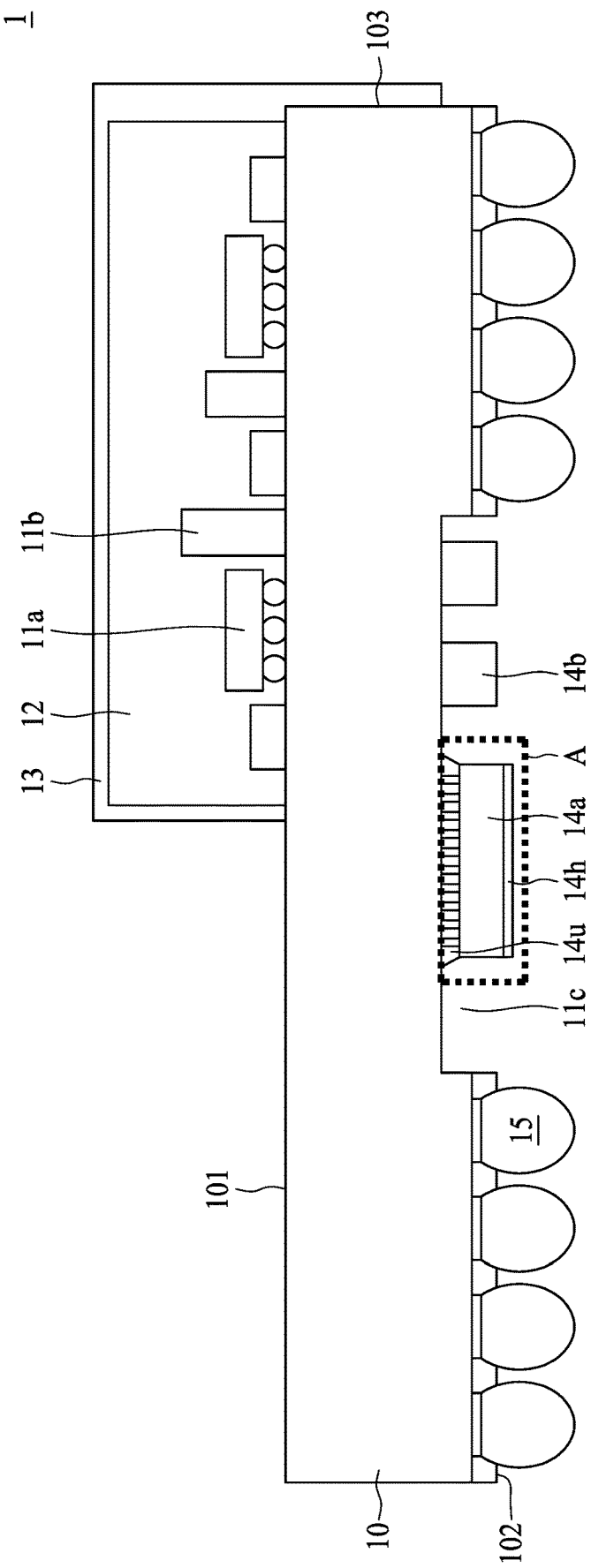
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1 in accordance with some embodiments of the present disclosure. The semiconductor device package 1 includes a substrate 10, electronic components 11a, 11b, 14a, 14b, a package body 12, a shield 13 and electrical contacts 15.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL). In some embodiments, the substrate 10 is or includes a multi-layer substrate. The substrate 10 has a surface 101, a surface 102 opposite to the surface 101 and a lateral surface 103 extending between the surface 101 and the surface 102. The substrate 10 defines a cavity 11c from the surface 102 into the substrate 10.

The electronic components 11a and 11b are disposed on the surface 101 of the substrate 10. The electronic components 11a may be an active component or another semiconductor device, such as an integrated circuit (IC) chip or a die. In some embodiments, the electronic components 11a could be any active component or another semiconductor package device. The electronic components 11b may be passive components, such as capacitors, resistors or inductors. The electronic components 11a and 11b may be electrically connected to one or more of another electronic component and/or the substrate 10 (e.g., to the interconnection layer), and electrical connection may be attained by way of flip-chip, wire-bond techniques or surface mount technology (SMT).

The package body 12 is disposed on the surface 101 of the substrate 10. In some embodiments, the package body 12 is disposed on a portion of the surface of the substrate 10 and covers the electronic components 11a and 11b. In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof.

The shield 13 is disposed on external surfaces of the package body 12 (e.g., a top surface and lateral surfaces) and covers the package body 12 and electrical components 11a, 11b. In some embodiments, the shield 13 covers at least a portion of the lateral surface 103 of the substrate 10. The shield 13 is electrically connected to grounding elements of the substrate 10. In some embodiments, the shield 13 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shield 13 may include a single conductive layer or multiple conductive layers. In some embodiments, the shield 13 includes multiple conductive layers, and the multiple conductive layers may include a same material, or ones of the multiple conductive layers may include different materials, or each of the multiple conductive layers may include different materials from others of the multiple conductive layers. The shield 13 can prevent the electronic components 11a, 11b from electromagnetic interference (EMI).

The electronic components 14a and 14b are disposed within the cavity 14c of the substrate 10. The electronic components 14a may be an active component, such as an IC chip or a die. In some embodiments, the electronic component 14a is a system-on-a-chip (SoC), which may include one or more processors, controllers or any other suitable electronic devices. The electronic component 14b may be a passive component, such as a capacitor, a resistor or an inductor. The electronic components 14a and 14b may be electrically connected to one or more of another electronic component and/or the substrate 10 (e.g., to the interconnection layer), and electrical connection may be attained by way of flip-chip or wire-bond techniques or SMT. In some embodiments, an underfill 14u may be disposed between an active surface of the electronic component 14a and the substrate 10. In some embodiments, a portion of the electronic components 14a and 14b may be exposed from the surface 102 of the substrate 10. For example, a thickness of the electronic component 14a or 14b is greater than a depth of the cavity 11c. In other embodiments, the thickness of the electronic component 14a or 14b is equal to or less than the depth of the cavity 11c.

In some embodiments, a heat dissipation element 14h may be disposed on a backside surface of the active component (e.g., the electronic component 14a). In some embodiments, the heat dissipation element 14h includes may include, but is not limited to, graphite, graphene, a carbon fiber, a boron nitride or the like. In other embodiments, the heat dissipation element 14h may include a structure as shown in FIG. 1B, which illustrates an enlarged portion of a portion of the semiconductor device package 1 encircled by a dotted line A. As shown in FIG. 1B, a graphite film 14h1 is disposed on the backside surface of the electronic component 14a, and a conductive layer 14h2 is disposed on the graphite film to further improve the heat dissipation. In some embodiments, the heat dissipation element 14h can be omitted depending on different design specifications.

The electrical contacts 15 are disposed on the surface 102 of the substrate 10 and may be electrically connected to the substrate 10. In some embodiments, the electrical contacts 15 are Controlled Collapse Chip Connection (C4) bumps, solder bumps, one or more Land Grid Arrays (LGA), or a combination of two or more thereof.

In accordance with the embodiments as shown in FIG. 1A, since the electronic components 14a and 14b are disposed within the cavity 11c defined by the substrate 10, the thickness of the semiconductor device package 1 can be reduced. In addition, a distance between the electronic component 14a or 14b and a bottom portion of the electrical contacts (or a distance between the electronic component 14a or 14b and a circuit board on which the semiconductor device package 1 is bonded) increases, which can prevent the electronic components 14a and 14b from being damaged. Furthermore, it is flexible to select the size of the electrical contacts 15.

Figure 2A:
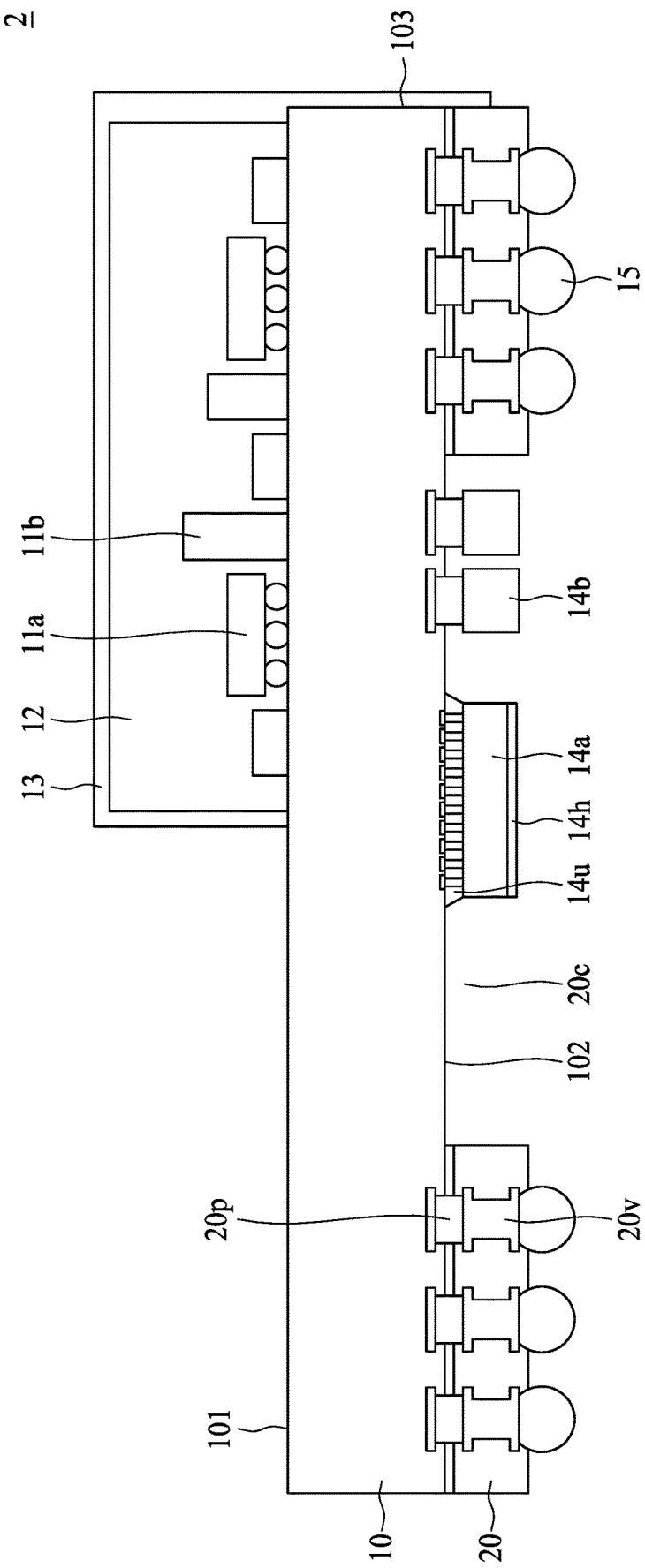
FIG. 2A illustrates a cross-sectional view of a semiconductor device package in accordance with some embodiments of the present disclosure.

FIG. 2A illustrates a cross-sectional view of a semiconductor device package 2 in accordance with some embodiments of the present disclosure. The semiconductor device package 2 is similar to the semiconductor device package 1 in FIG. 1A, and the differences therebetween are described blow.

A frame board 20 (or interposer) is disposed on the surface 102 of the substrate 10. In some embodiments, the shield 13 is disposed on the lateral surface 103 of the substrate 10 and at least a portion of the lateral surface of the frame board 20. The frame board 20 has an opening 20c to accommodate the electronic components 14a and 14b, which are disposed on the surface 102 of the substrate 10. The frame board 20 surrounds the electronic components 14a and 14b. The frame board 20 may include at least one via 20v penetrating the frame board 20 and electrically connecting the substrate 10 to the electrical contacts 15. In some embodiments, the frame board 20 is electrically connected to the substrate 10 through an adhesive element 20p (e.g., pre-solder). The frame board 20 and the electrical contacts 15 may be arranged in or near the periphery of surface 102 of the substrate 10. The frame board 20 may include, for example, a printed circuit board, such as a paper-based copper foil laminate, a composite copper foil laminate, or a polymer-impregnated glass-fiber-based copper foil laminate.

In accordance with the embodiments as shown in FIG. 2A, since the electronic components 14a and 14b are disposed within the cavity defined by the frame board 20, a distance between the electronic component 14a or 14b and a bottom portion of the electrical contacts (or a distance between the electronic component 14a or 14b and a circuit board on which the semiconductor device package 2 is bonded) increases, which can prevent the electronic components 14a and 14b from being damaged. Furthermore, it is flexible to select the size of the electrical contacts 15.

Figure 2B:
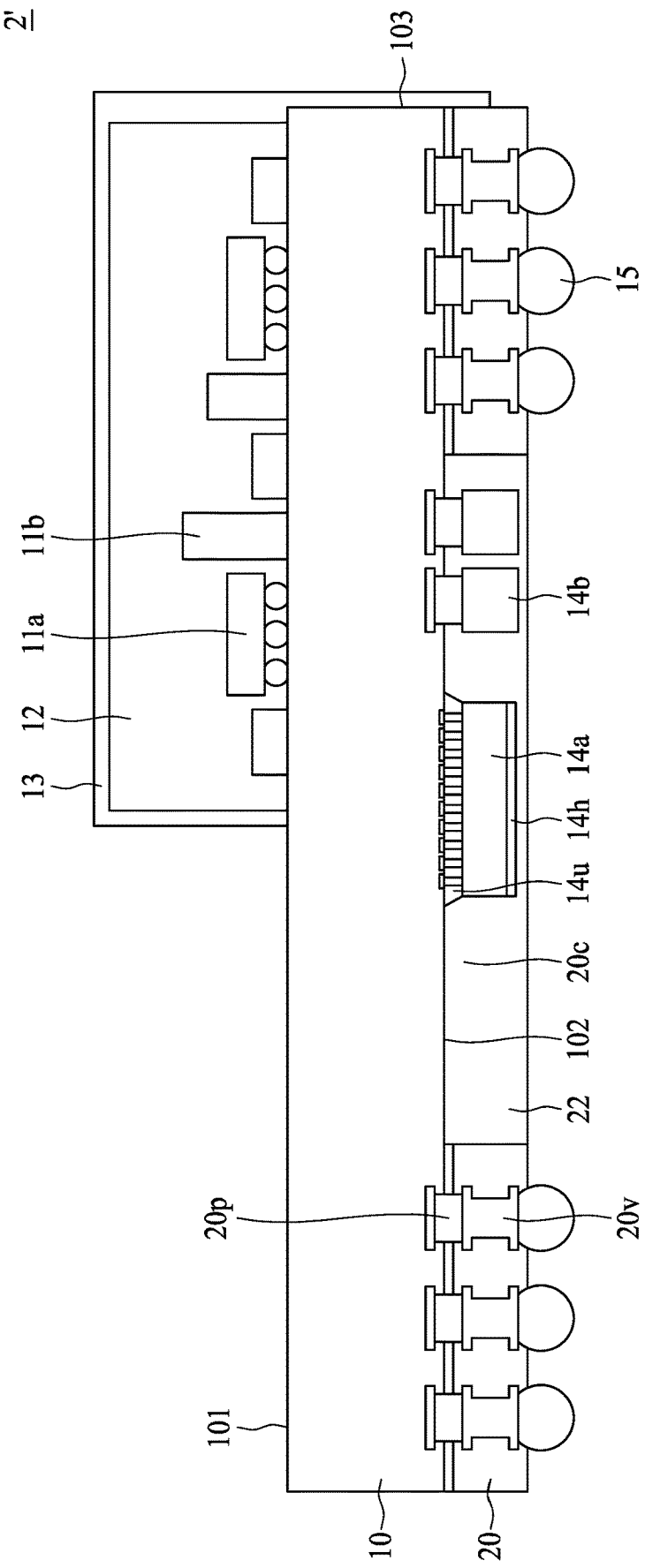
FIG. 2B illustrates a cross-sectional view of a semiconductor device package in accordance with some embodiments of the present disclosure.

FIG. 2B illustrates a cross-sectional view of a semiconductor device package 2' in accordance with some embodiments of the present disclosure. The semiconductor device package 2' is similar to the semiconductor device package 2 in FIG. 2A except that the semiconductor device package 2' further includes a package body 22 disposed within the cavity 20c to cover the electronic components 14a and 14b.

Figure 3:
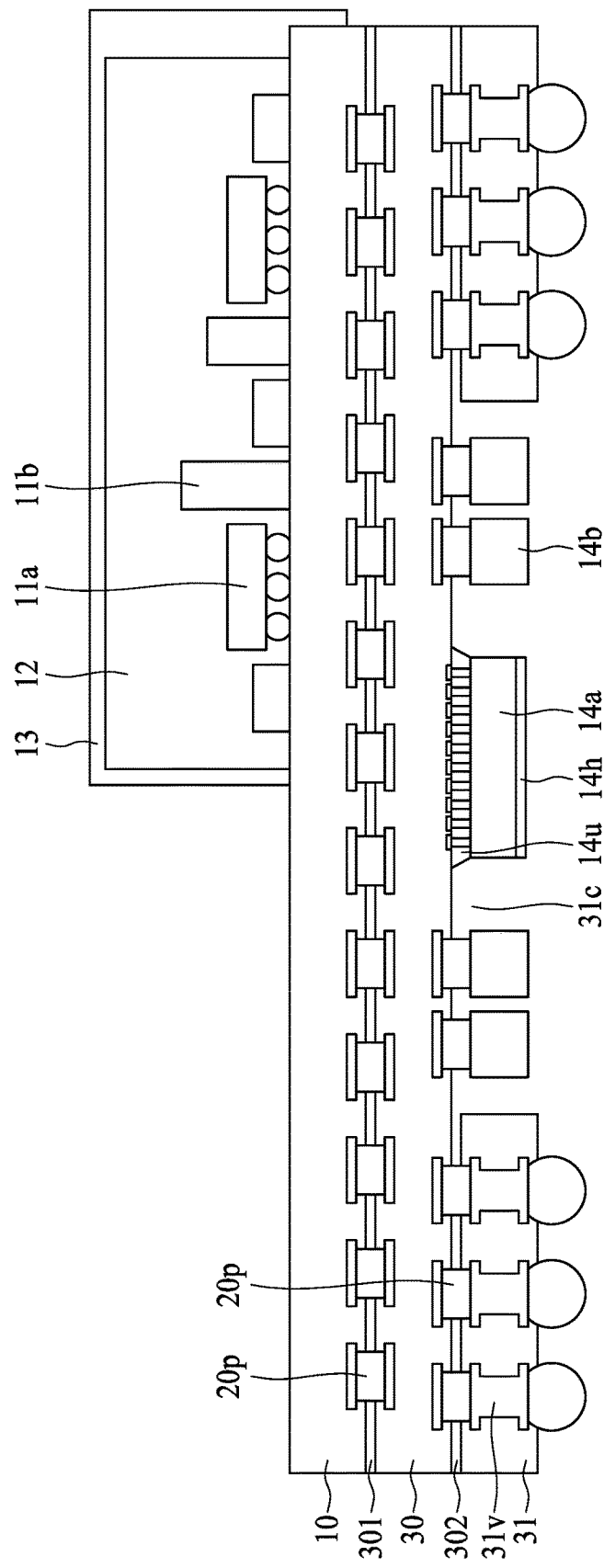
FIG. 3 illustrates a cross-sectional view of a semiconductor device package in accordance with some embodiments of the present disclosure.

FIG. 3 illustrates a cross-sectional view of a semiconductor device package 2 in accordance with some embodiments of the present disclosure. The semiconductor device package 3 is similar to the semiconductor device package 1 in FIG. 1, and the differences therebetween are described blow.

A substrate 30 is disposed on the surface 102 of the substrate 10. The substrate 30 may be, for example, a PCB, such as a paper-based copper foil laminate, a composite copper foil laminate, a polymer-impregnated glass-fiber-based copper foil laminate, or a combination of two or more thereof. The substrate 30 may include an interconnection structure, such as a RDL. In some embodiments, the substrate 30 is or includes a multi-layer substrate. In some embodiments, the number of the layers of the substrate 30 can be the same as, greater than or less than the number of the layers of the substrate 10 depending on different design specifications. The substrate 30 has a surface 301 facing the substrate 10 and a surface 302 opposite to the surface 301. The substrate 30 may be electrically connected to the substrate 10 through the adhesive element 20*p* (e.g., pre-solder)

A frame board 31 (or interposer) is disposed on the surface 302 of the substrate 30. The frame board 31 has an opening 31*c* to accommodate the electronic components 14*a* and 14*b*, which are disposed on the surface 302 of the substrate 30. The frame board 31 surrounds the electronic components 14*a* and 14*b*. The frame board 31 is arranged in or near the periphery of surface 302 of the substrate 30. The frame board 31 may include at least one via 31*v* penetrating the frame board 31 and electrically connected to the substrate 30. In some embodiments, the frame board 31 is electrically connected to the substrate 30 through the adhesive element 20*p* (e.g., pre-solder). The frame board 31 may include, for example, a printed circuit board, such as a paper-based copper foil laminate, a composite copper foil laminate, or a polymer-impregnated glass-fiber-based copper foil laminate.

In accordance with the embodiments as shown in FIG. 3, since the electronic components 14*a* and 14*b* are disposed within the cavity defined by the frame board 31, a distance between the electronic component 14*a* or 14*b* and a bottom portion of the electrical contacts (or a distance between the electronic component 14*a* or 14*b* and a circuit board on which the semiconductor device package 2 is bonded) increases, which can prevent the electronic components 14*a* and 14*b* from being damaged. Furthermore, it is flexible to select the size of the electrical contacts 15.

FIG. 4A, FIG. 4B, FIG. 4C, FIG. 4D, FIG. 4E, FIG. 4F, FIG. 4G and FIG. 4H illustrate a semiconductor manufacturing method in accordance with some embodiments of the present disclosure. In some embodiments, the method in FIG. 4A, FIG. 4B, FIG. 4C, FIG. 4D, FIG. 4E, FIG. 4F, FIG. 4G and FIG. 4H can be used to manufacture the semiconductor device package 2 in FIG. 2.

Figure 4A:
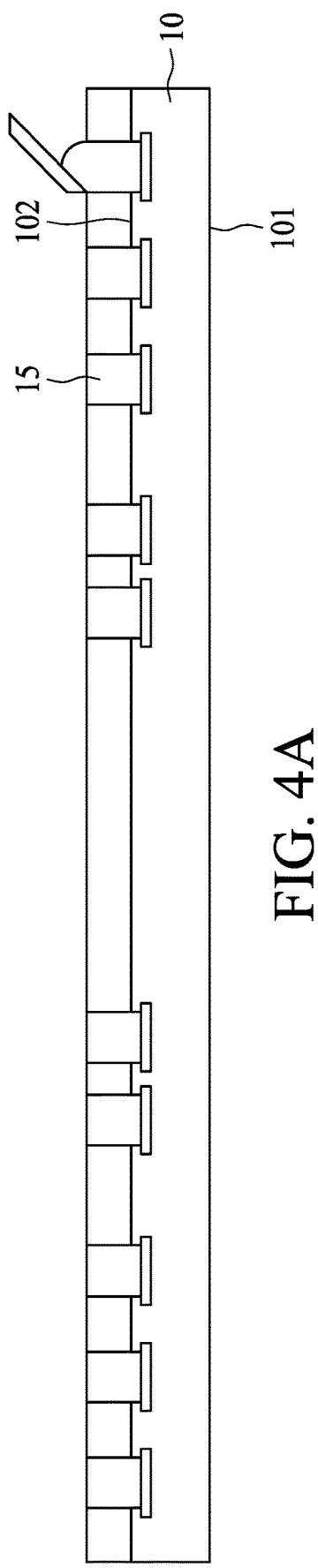
FIG. 4A, FIG. 4B, FIG. 4C, FIG. 4D, FIG. 4E, FIG. 4F, FIG. 4G and FIG. 4H illustrate a semiconductor manufacturing method in accordance with some embodiments of the present disclosure.
Figure 4B:
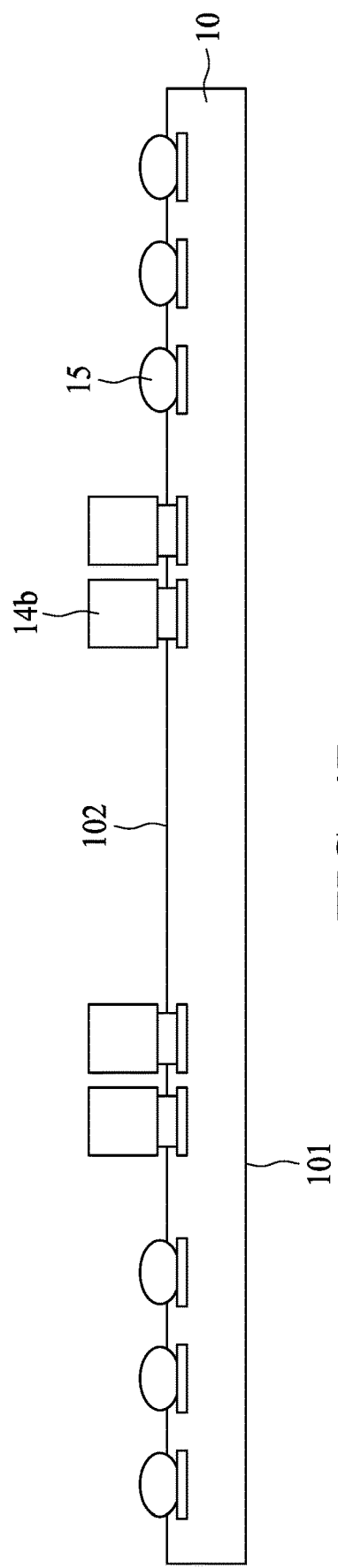
Figure 4C:
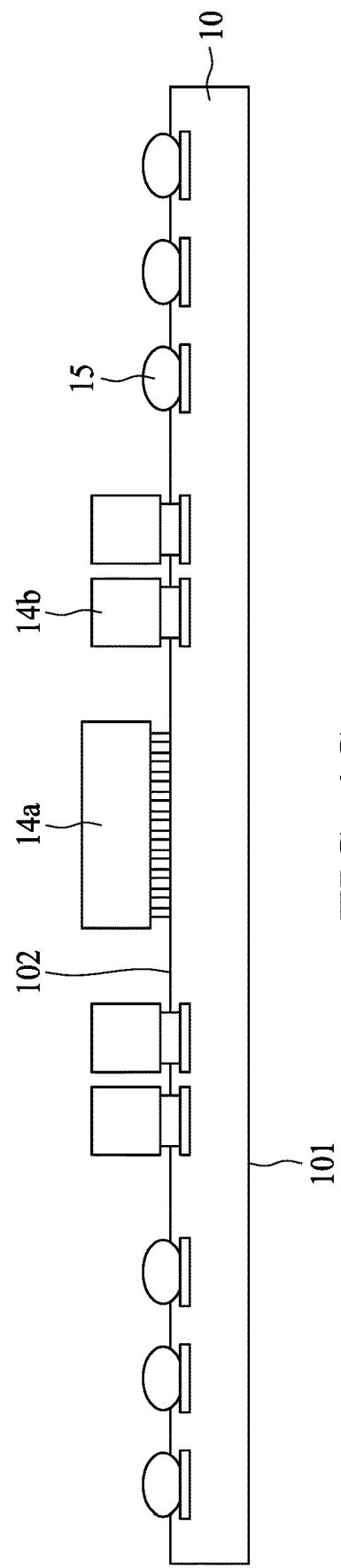
Figure 4D:
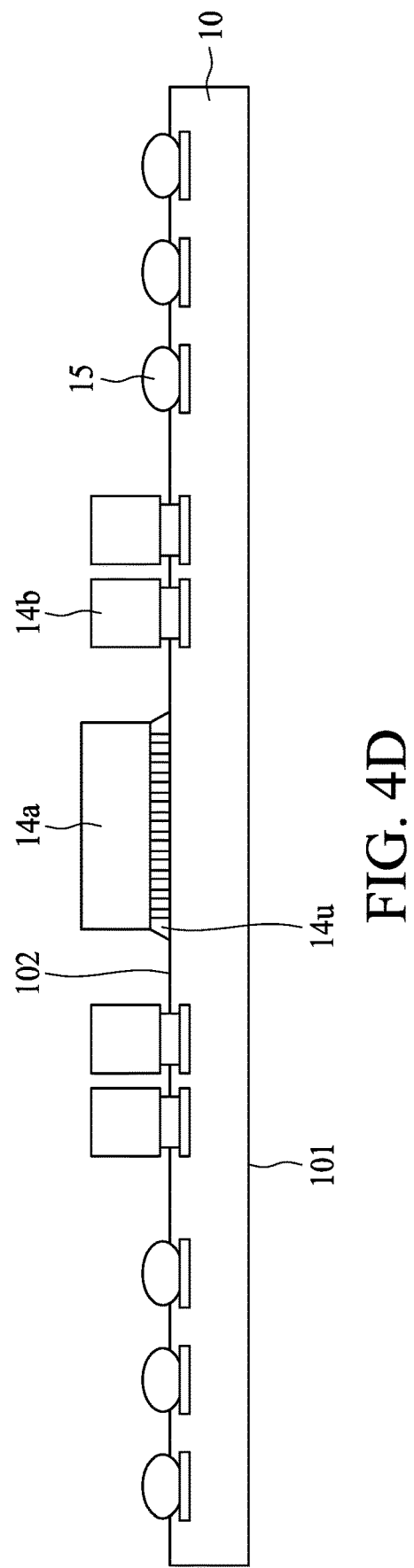

Referring to FIG. 4A, a strip of substrates including the substrate 10 is provided, and solder paste printing is performed on a surface 102 of the substrate 10. Referring to FIG. 4B, electronic components 14*b* are disposed on the surface 102 of the substrate 10 by, for example, side mount technology (SMT). Referring to FIG. 4C, an electronic component 14*a* is bonded to the surface 102 of the substrate 10. Then, an underfill 14*u* may be formed between the active surface of the electronic component 14*a* and the surface 102 of the substrate 10 as shown in FIG. 4D. In some embodiments, a strip test (e.g., active temperature control, ATC) may be carried out.

Figure 4E:
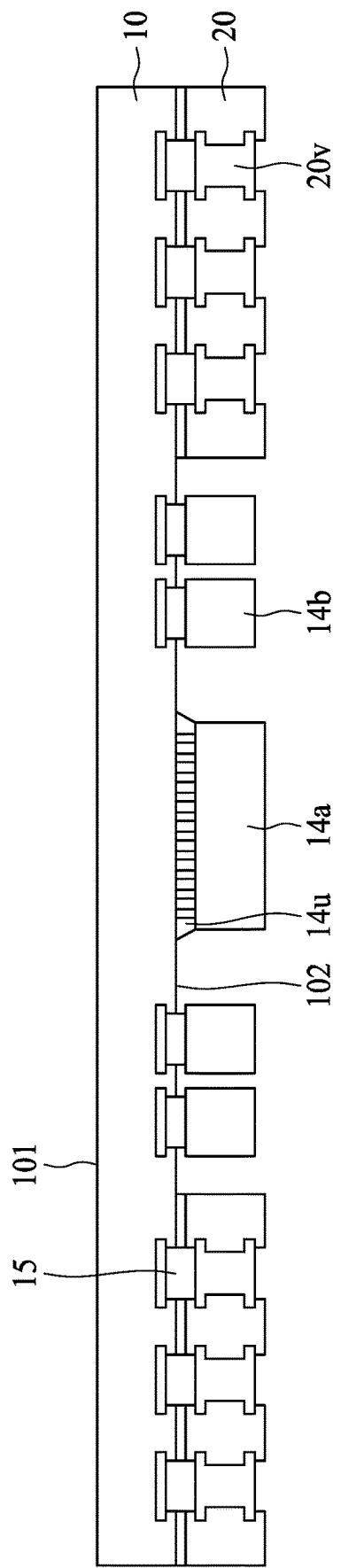
Figure 4F:
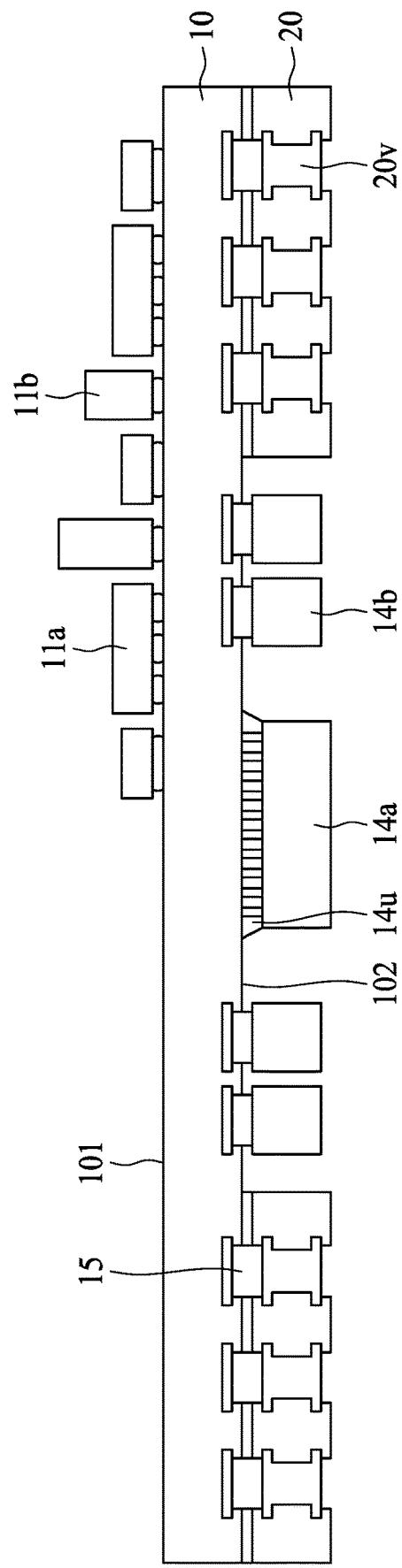

Referring to FIG. 4E, a frame board 20 with vias 20*v* penetrating the frame board 20 is disposed on the surface 102 of the substrate 10 to surround the electronic components 14*a* and 14*b*. In some embodiments, the frame board 20 is disposed on the surface 102 of the substrate 10 by, for example, lamination. Then, the reflow and press operations may be carried out to bond the frame board 20 to the substrate 10. Referring to FIG. 4F, solder paste printing is performed on a surface 101 of the substrate 10, and then electronic components 11*a* and 11*b* are disposed on the surface 101 of the substrate 10 by, for example, SMT.

Figure 4G:
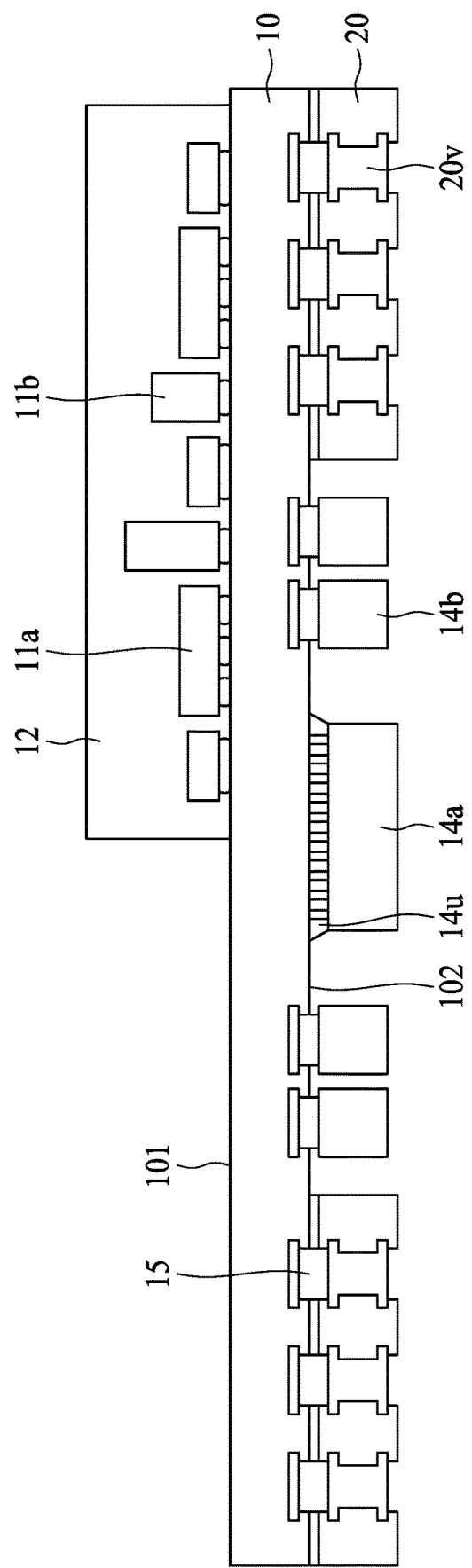

Referring to FIG. 4G, a package body 12 is formed on a portion of the surface 101 of the substrate 10 to cover or encapsulate the electronic components 11*a* and 11*b*. In some embodiments, the package body 12 is formed by, for example, molding technique (e.g., selective molding). Then, a singulation is performed to separate the substrate strips including the substrate 10. In some embodiments, after singulation, a lateral surface of the package body 12 is recessed from a lateral surface of the individual substrate 10.

Figure 4H:
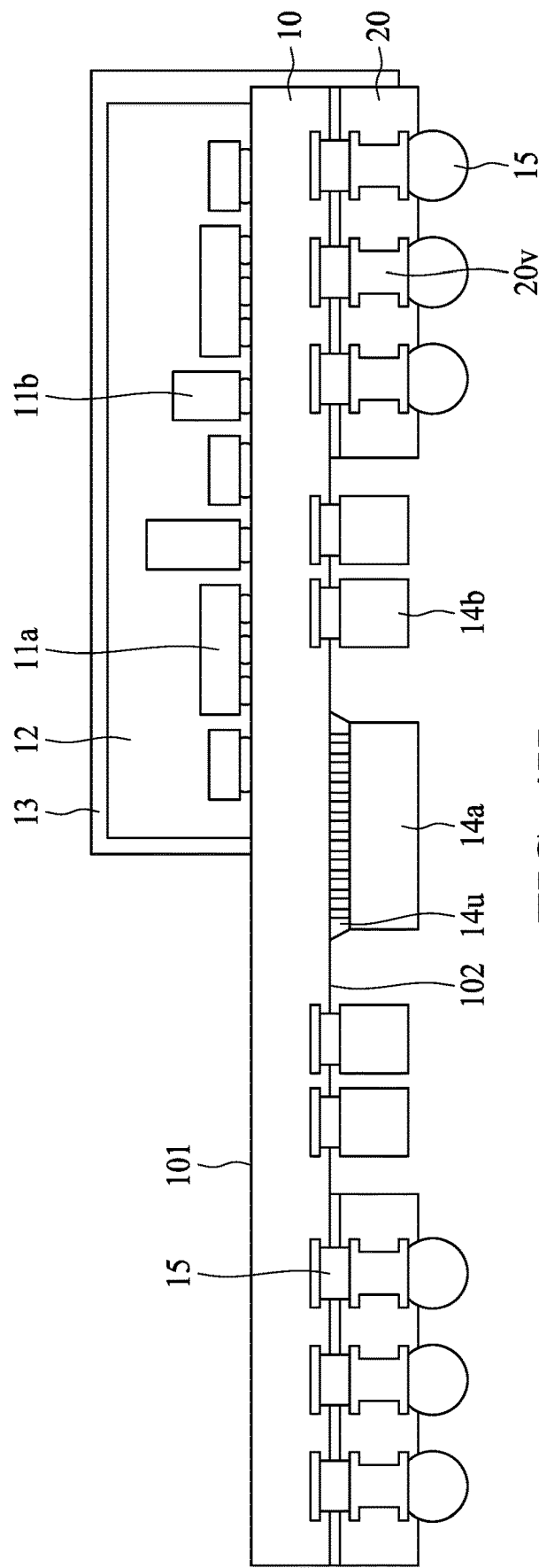

Referring to FIG. 4H, a shield 13 is formed on the external surfaces of the package body 12. In some embodiments, the shield 13 may be also formed on the lateral surface of the substrate 10 and a portion of the lateral surface of the frame board 20. In some embodiments, the shield 13 is formed by, for example, sputtering (e.g., selective sputtering). Electrical contacts 15 are then formed on the vias 20*v* exposed from the frame board 20 to form the semiconductor device package as shown in FIG. 2. In some embodiments, a test (e.g., open/short test) may be carried out on the individual semiconductor device package 2.

FIG. 5A, FIG. 5B, FIG. 5C and FIG. 5D illustrate a semiconductor manufacturing method in accordance with some embodiments of the present disclosure. In some embodiments, the method in FIG. 5A, FIG. 5B, FIG. 5C and FIG. 5D can be used to manufacture a portion of the semiconductor device package 3 in FIG. 3 (e.g., including the substrate 10 and the structure above the structure 10).

Figure 5A:
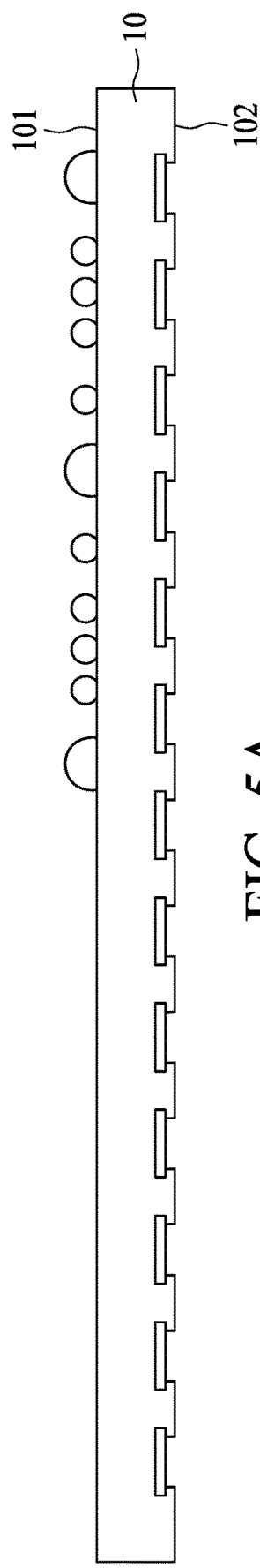
FIG. 5A, FIG. 5B, FIG. 5C and FIG. 5D illustrate a semiconductor manufacturing method in accordance with some embodiments of the present disclosure.
Figure 5B:
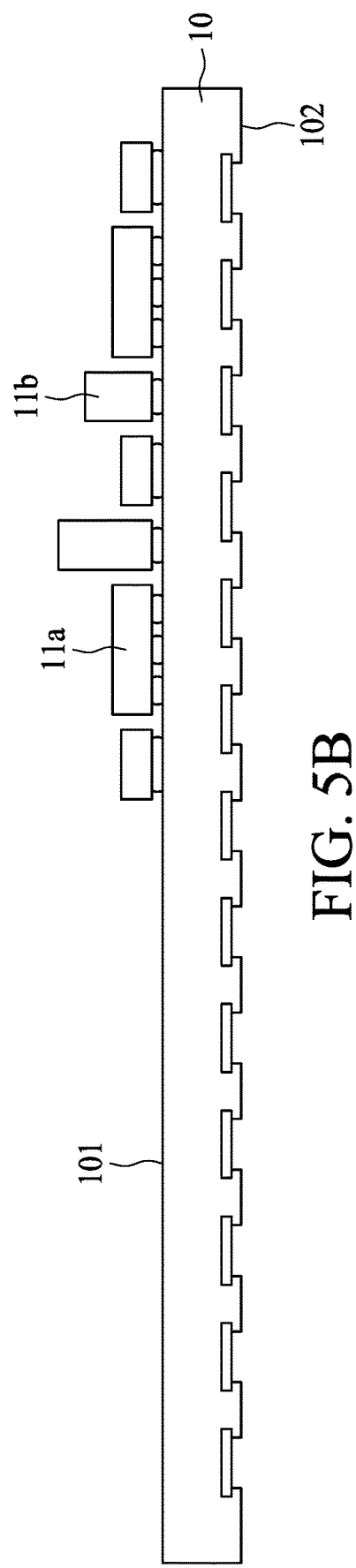

Referring to FIG. 5A, a strip of substrates including a substrate 10 is provided, and solder paste printing is performed on a surface 101 of the substrate 10. Referring to FIG. 5B, electronic components 11*a* and 11*b* are disposed on the surface 101 of the substrate 10 by, for example, SMT.

Figure 5C:
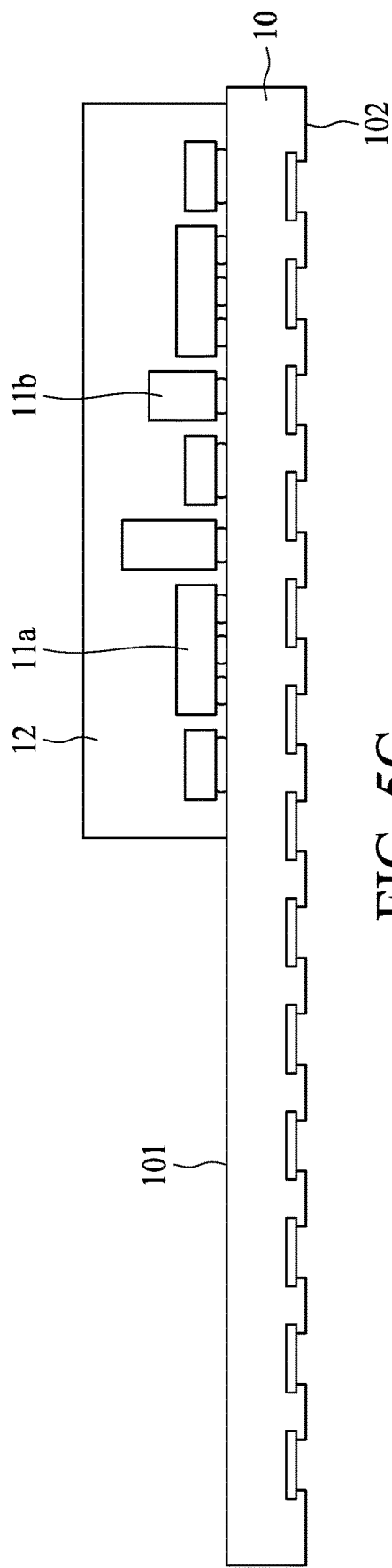

Referring to FIG. 5C, a package body 12 is formed on a portion of the surface 101 of the substrate 10 to cover or encapsulate the electronic components 11*a* and 11*b*. In some embodiments, the package body 12 is formed by, for example, molding technique (e.g., selective molding). Then, a singulation is performed to separate the substrate strips including the substrate 10. In some embodiments, after singulation, a lateral surface of the package body 12 is recessed from a lateral surface of the individual substrate 10.

Figure 5D:
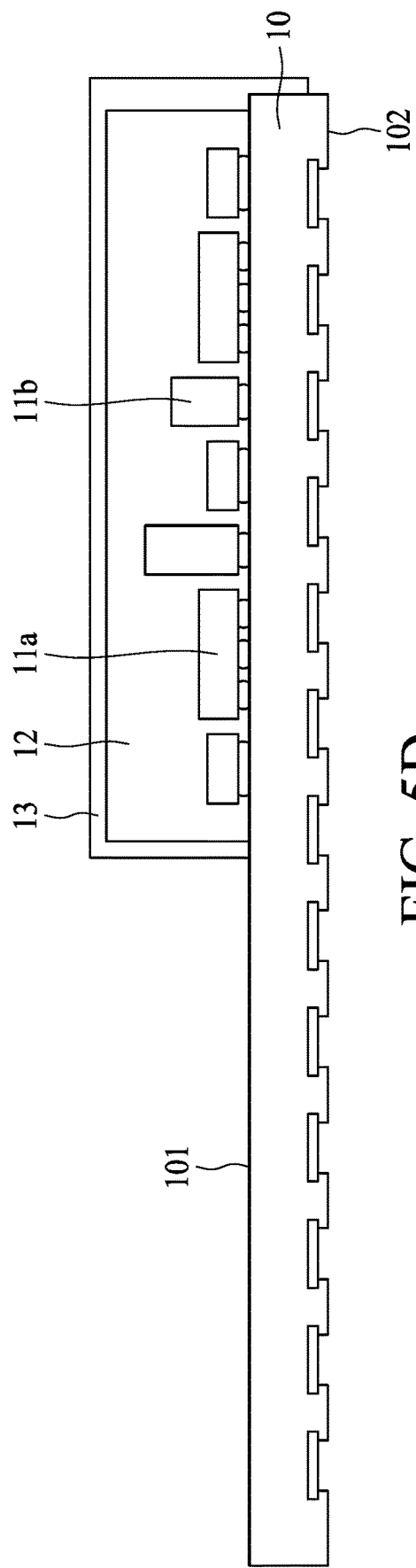

Referring to FIG. 5D, a shield 13 is formed on the external surfaces of the package body 12. In some embodiments, the shield 13 may be also formed on at least a portion of the lateral surface of the substrate 10. In some embodiments, the shield 13 is formed by, for example, sputtering (e.g., selective sputtering). In some embodiments, a test (e.g., open/short test) may be carried out on the individual structure as shown in FIG. 5D.

FIG. 6A, FIG. 6B, FIG. 6C, FIG. 6D and FIG. 6E illustrate a semiconductor manufacturing method in accordance with some embodiments of the present disclosure. In some embodiments, the method in FIG. 6A, FIG. 6B, FIG. 6C, FIG. 6D and FIG. 6E can be used to manufacture a portion of the semiconductor device package 3 in FIG. 3 (e.g., including the substrate 30 and the structure below the substrate 30).

Figure 6A:
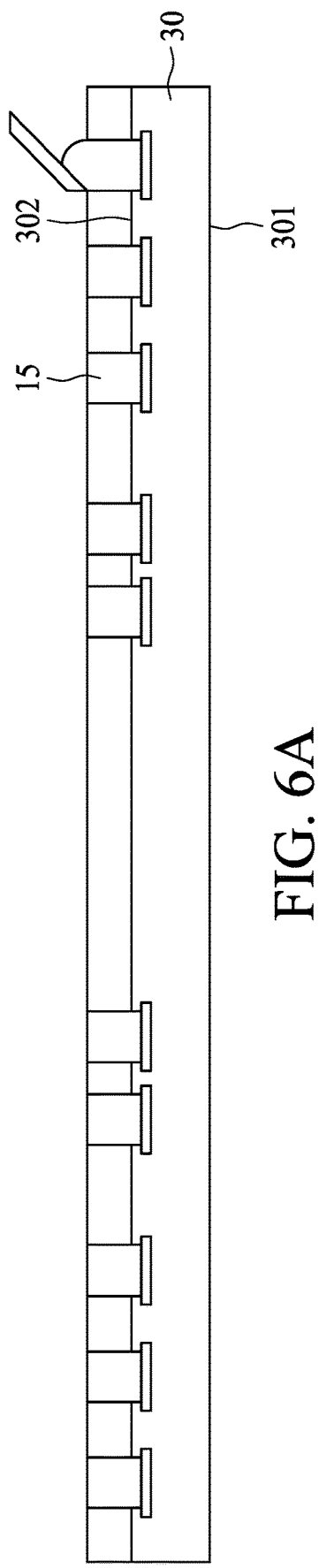
FIG. 6A, FIG. 6B, FIG. 6C, FIG. 6D and FIG. 6E illustrate a semiconductor manufacturing method in accordance with some embodiments of the present disclosure.
Figure 6B:
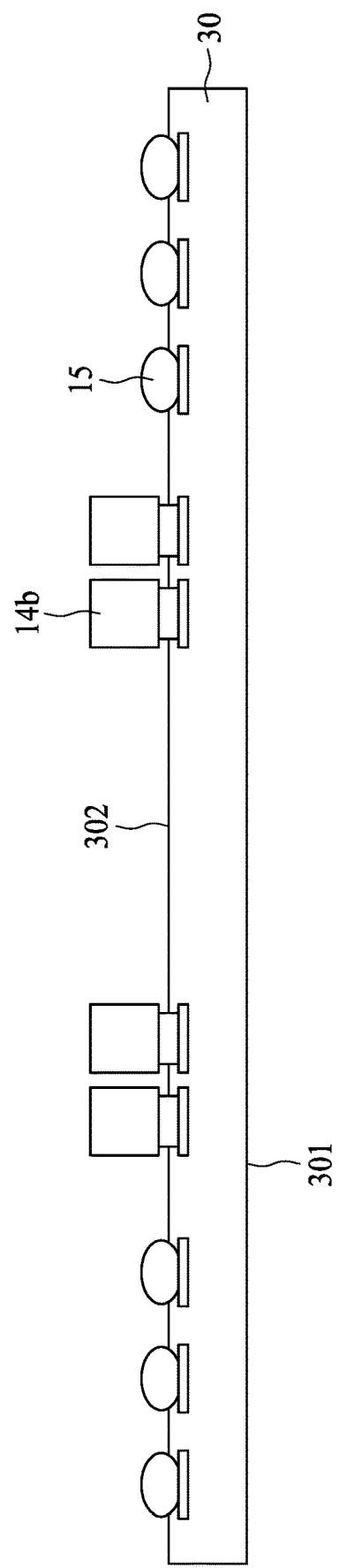
Figure 6C:
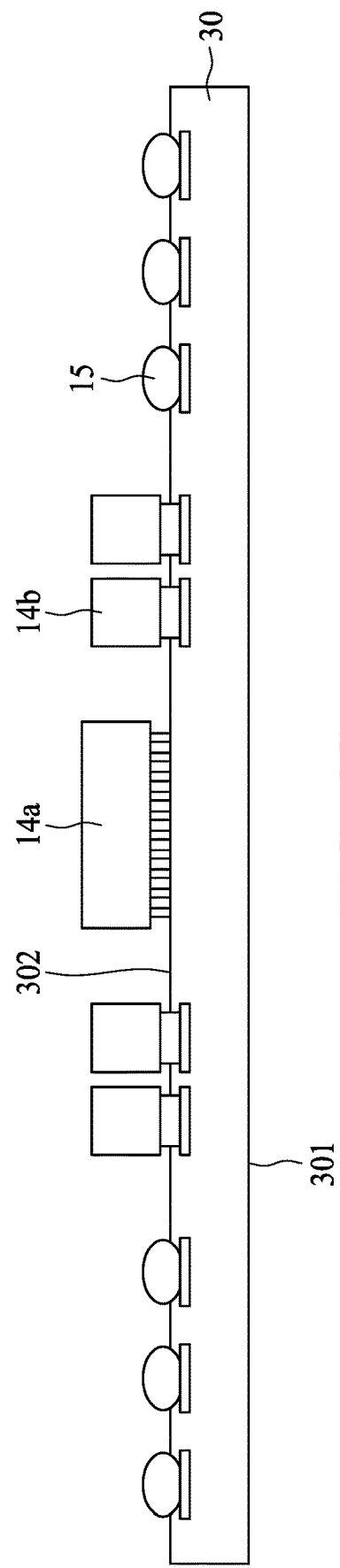
Figure 6D:
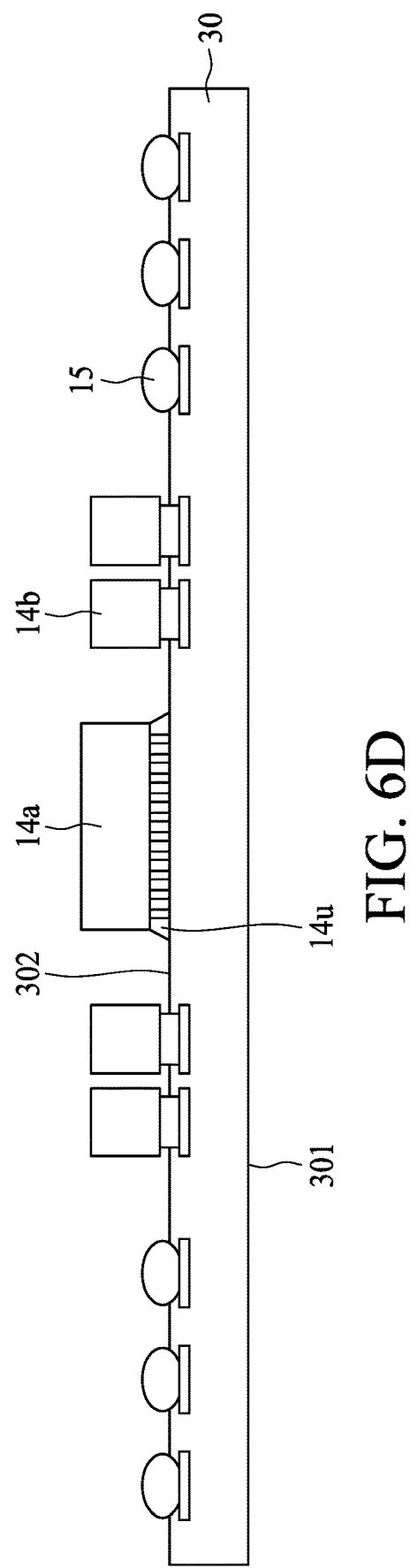

Referring to FIG. 6A, a strip of substrates including the substrate 30 is provided, and solder paste printing is performed on a surface 302 of the substrate 30. Referring to FIG. 6B, electronic components 14*b* are disposed on the surface 302 of the substrate 30 by, for example, side mount technology (SMT). Referring to FIG. 6C, an electronic component 14*a* is bonded to the surface 302 of the substrate 30. Then, an underfill 14*u* may be formed between the active surface of the electronic component 14*a* and the surface 302 of the substrate 30 as shown in FIG. 6D.

Figure 6E:
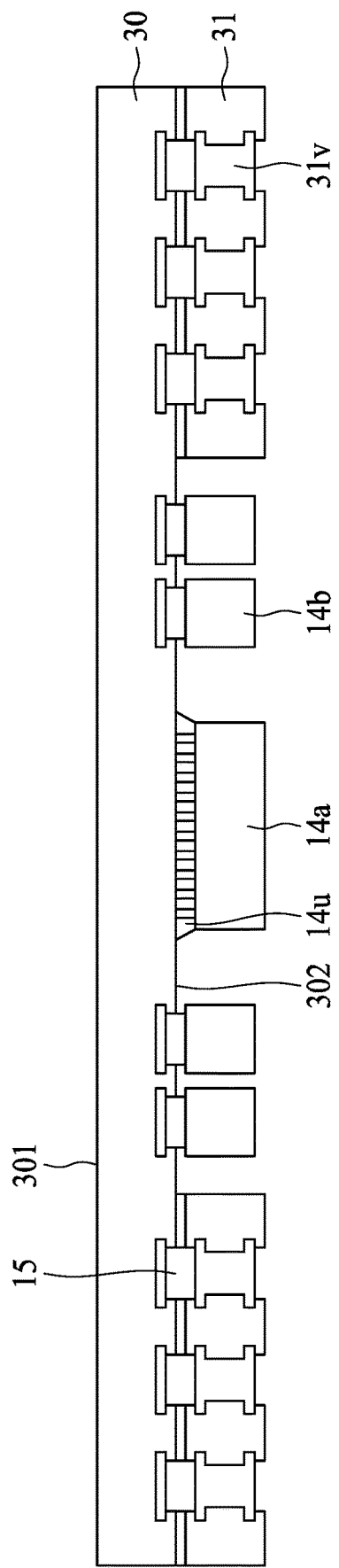

Referring to FIG. 6E, a frame board 31 with vias 31*v* penetrating the frame board 31 is disposed on the surface 302 of the substrate 30 to surround the electronic components 14*a* and 14*b*. In some embodiments, the frame board 31 is disposed on the surface 302 of the substrate 30 by, for example, lamination. Then, the reflow and press operations may be carried out to bond the frame board 31 to the substrate 30. Then, a singulation is performed to separate the substrate strips including the substrate 30. In some embodiments, a unit test (e.g., ATC) may be carried out on the individual structure as shown in FIG. 6E.

Figure 7A:
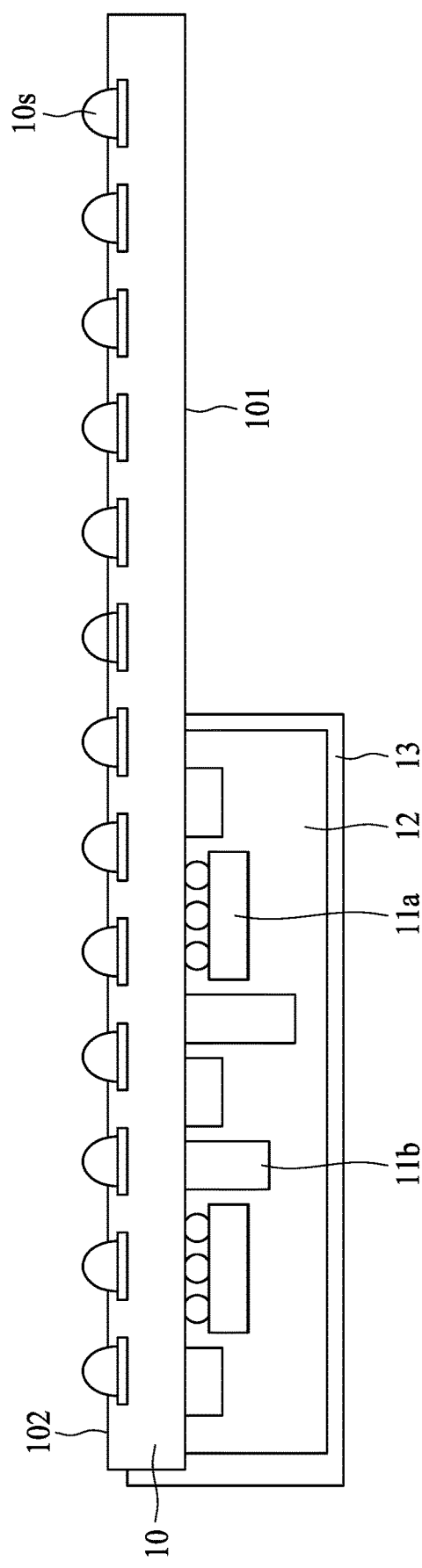
FIG. 7A and FIG. 7B illustrate a semiconductor manufacturing method in accordance with some embodiments of the present disclosure.
Figure 7B:
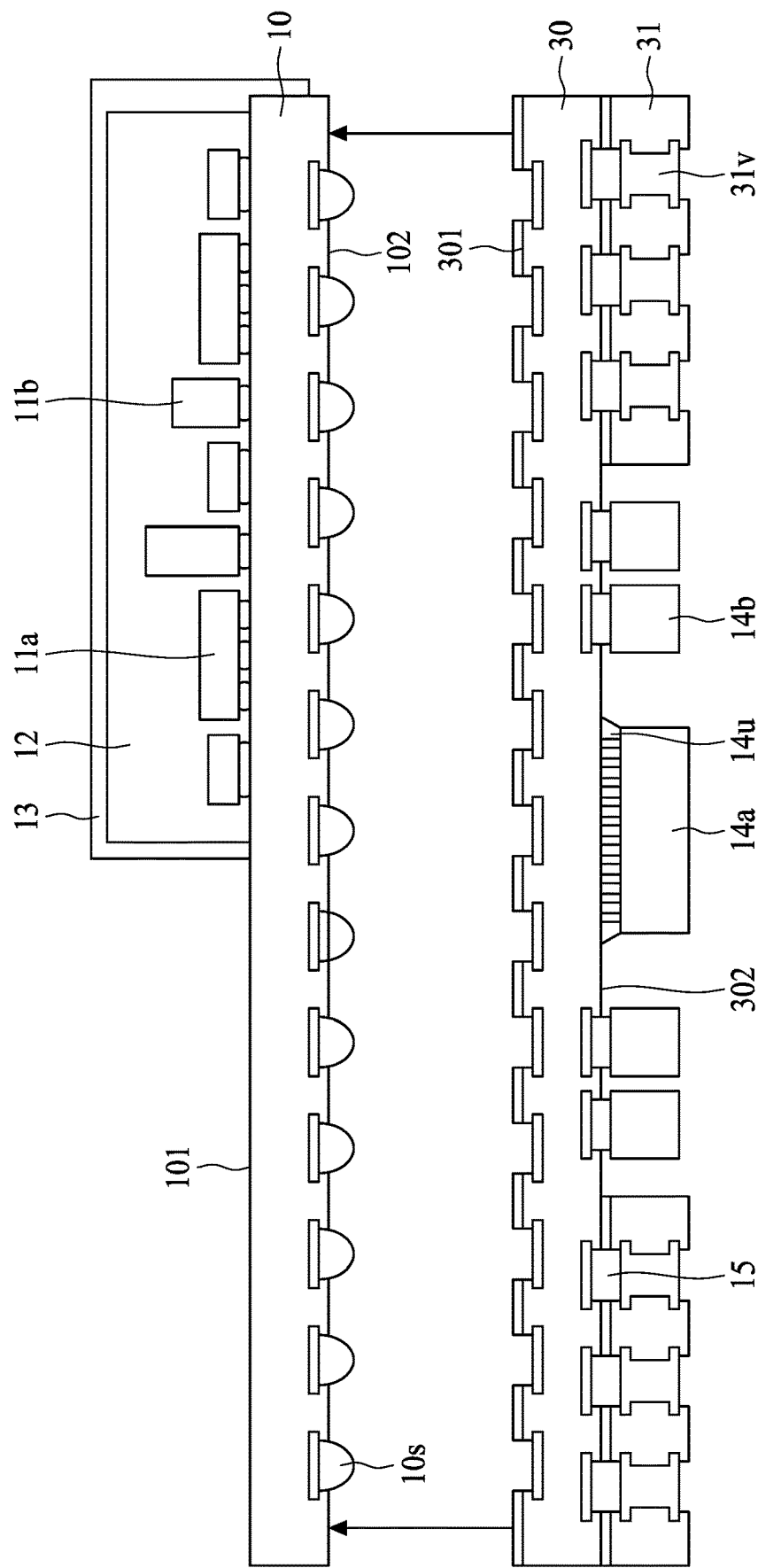

FIGS. 7A and 7B illustrate a semiconductor manufacturing method in accordance with some embodiments of the present disclosure. In some embodiments, the method in FIGS. 7A and 7B can be used to manufacture the semiconductor device package 3 in FIG. 3.

Referring to FIG. 7A, the structure as shown in FIG. 5D is provided, and solder paste printing is performed on a surface 102 of the substrate 10 to form solder pastes 10*s*.

Referring to FIG. 7B, the structure as shown in FIG. 6E is disposed on the surface 102 of the substrate 10. In some embodiments, the structure as shown in FIG. 6E is disposed on the surface 102 of the substrate 10 by, for example, lamination. Then, the reflow and press operations may be carried out to bond the structure as shown in FIG. 6E to the substrate 10 to form the semiconductor device package 3 as shown in FIG. 3.

In accordance with the embodiments as shown in FIGS. 4A-4H, the strip test is performed to the electronic components 14*a*, 14*b* disposed on one surface (e.g., surface 102) of the strip of the substrates, and then a singulation is performed after the electronic components 11*a*, 11*b* are connected to the other surface (e.g., surface 101) of the strip of substrates. Therefore, even if some of the electronic components 14*a*, 14*b* do not pass the strip test, the electronic component 11*a*, 11*b* will be still disposed on the unit of the substrate on which those defective electronic components 14*a*, 14*b* are disposed, which will decrease the yield rate of the semiconductor device package and increase the manufacturing cost. In addition, the open/short test is carried out to the electronic components 11*a*, 11*b* after all the electronic components 11*a*, 11*b*, 14*a* and 14*b* are connected to the both surfaces of the substrate 10. Therefore, if the electronic components 11*a*, 11*b* do not pass the test, the entire device package fails regardless whether the electronic components 14*a*, 14*b* pass the strip test as mentioned above, which will decrease the yield rate of the semiconductor device package and increase the manufacturing cost.

As shown in FIGS. 5A-5D, the open/short test is performed to the electronic components 11*a*, 11*b* disposed on the individual substrate 10 after singulation process. As shown in FIGS. 6A-6E, the unit test is performed to the electronic components 14*a*, 14*b* disposed on the individual substrate 30 after singulation process. As shown in FIGS. 7A and 7B, the structure shown in FIG. 5D, which passes the open/short test, and the structure shown in FIG. 6E, which passes the unit test, are connected to form the semiconductor device package 3. This can increase the yield rate of the semiconductor device package and reduce the manufacturing cost.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a first substrate having a first surface and a second surface opposite to the first surface;
a first electronic component disposed on the first surface of the first substrate;
a second electronic component disposed on the second surface of the first substrate;
a frame board disposed on the second surface of the first substrate, wherein the frame board is electrically connected to the first substrate through an adhesive element;
a first package body disposed on a portion of the first surface of the first substrate and covering the first electronic component; and
a second package body covering the second electronic component.

2. The semiconductor device package of claim 1, wherein the frame board is disposed in or near the periphery of second surface of the first substrate.

3. The semiconductor device package of claim 1, wherein the frame board includes conductive vias penetrating the frame board and electrically connected to the first substrate.

4. The semiconductor device package of claim 1, further comprising a second substrate disposed between the first substrate and the frame board, wherein the second substrate has a first surface facing the first substrate and a second surface facing the second electronic component.

5. The semiconductor device package of claim 4, wherein the second electronic component is disposed directly on the second surface of the second substrate.

6. The semiconductor device package of claim 4, wherein the first substrate is connected to the second substrate through a conductive adhesion.

7. The semiconductor device package of claim 1, further comprising electrical contacts disposed on a surface of the frame board facing away from the first substrate.

8. The semiconductor device package of claim 1, wherein the first package body has a lateral surface recessed from a lateral surface of the first substrate.

9. The semiconductor device package of claim 1, further comprising a shield disposed on external surfaces of the first package body.

10. The semiconductor device package of claim 1, wherein a thickness of the second electronic component is greater than a thickness of the frame board.

11. The semiconductor device package of claim 1, further comprising a heat dissipation element disposed on a backside surface of the second electronic component.

12. The semiconductor device package of claim 1, wherein the frame board surrounds the second package body.

13. The semiconductor device package of claim 9, wherein the shield is disposed on at least a portion of a lateral surface of the frame board.

14. The semiconductor device package of claim 9, wherein the shield is disposed on at least a portion of the first surface of the first substrate.

15. The semiconductor device package of claim 4, wherein the frame board includes conductive vias penetrating the frame board and electrically connected to the second substrate.

16. The semiconductor device package of claim 11, wherein the heat dissipation element comprises a graphite film disposed on the backside surface of the second electronic component.

17. The semiconductor device package of claim 16, wherein the heat dissipation element further comprises a conductive layer disposed on the graphite film.

18. The semiconductor device package of claim 1, wherein a lateral surface of the first package body exposes the first surface of the first substrate.

19. The semiconductor device package of claim 1, wherein the frame board surrounds the second electronic component.

20. The semiconductor device package of claim 9, wherein the shield is disposed on at least a portion of a lateral surface of the first substrate.

21. A semiconductor device package, comprising:
a first substrate having a first surface and a second surface opposite to the first surface;
a first electronic component disposed on the first surface of the first substrate;
a second electronic component disposed on the second surface of the first substrate;
a frame board disposed on the second surface of the first substrate; and
a first package body disposed on a portion of the first surface of the first substrate and covering the first electronic component, wherein the first package body has a lateral surface recessed from a lateral surface of the first substrate.

22. The semiconductor device package of claim 21, wherein the frame board surrounds the second electronic component.

23. The semiconductor device package of claim 21, further comprising a shield disposed on external surfaces of the first package body.

24. A semiconductor device package, comprising:
a first substrate having a first surface and a second surface opposite to the first surface;
a first electronic component disposed on the first surface of the first substrate;
a second electronic component disposed on the second surface of the first substrate;
a frame board disposed on the second surface of the first substrate, wherein the frame board is electrically connected to the first substrate through an adhesive element, wherein a thickness of the second electronic component is greater than a thickness of the frame board;
a first package body disposed on a portion of the first surface of the first substrate and covering the first electronic component.

* * * * *